(12) United States Patent
Brown et al.

(10) Patent No.: US 8,165,179 B2
(45) Date of Patent: Apr. 24, 2012

(54) CLOSED LOOP LASER CONTROL

(75) Inventors: Margaret K. Brown, Seattle, WA (US);
Joel D. Hopkins, Sammamish, WA (US); Jenchao J. Lin, Bothell, WA (US);
Lifford McLauchlin, Corpus Christi, TX (US)

(73) Assignee: Microvision, Inc., Redmond, WA (US)

( * ) Notice: Subject to any disclaimer, the term of this patent is extended or adjusted under 35 U.S.C. 154(b) by 791 days.

(21) Appl. No.: 12/343,224

(22) Filed: Dec. 23, 2008

(65) Prior Publication Data
US 2010/0156863 A1    Jun. 24, 2010

(51) Int. Cl.
*H01S 3/13*    (2006.01)
*H01S 3/00*    (2006.01)

(52) U.S. Cl. ........... 372/38.02; 372/29.011; 372/29.014; 372/29.015

(58) Field of Classification Search ............. 372/29.011, 372/29.014, 29.015, 38.01, 38.02
See application file for complete search history.

(56) References Cited

U.S. PATENT DOCUMENTS
2011/0205498 A1 * 8/2011 Brown et al. ................... 353/31
* cited by examiner

*Primary Examiner* — Armando Rodriguez
(74) *Attorney, Agent, or Firm* — Kevin D. Wills

(57) ABSTRACT

The radiance of a laser is a function of drive current. The radiance is also a function of other factors, such as age and temperature. A laser projection device adjusts laser drive parameters using a gradient descent operation. The device parameters may be adjusted iteratively and periodically. The period may be shorter or longer than a scan line in a video image.

16 Claims, 8 Drawing Sheets

CLOSED LOOP LASER CONTROL

FIELD

The present invention relates generally to laser projection systems, and more specifically to laser control in laser projection systems.

BACKGROUND

Lasers emit light in response to a current. For example, laser diodes produce light in response to a current in the diode. Also for example, semiconductor lasers also produce light in response to a current. The output radiance of a laser varies as the drive current is varied. The output radiance of a laser may also vary due to other factors. For example, the output radiance of a laser diode may vary with age. Also for example, the output radiance of a laser diode may vary as the temperature of the diode varies. This can be problematic in part because the temperature of a laser diode may be affected by ambient temperature changes as well as the historical drive current which results in "self-heating" of the diode.

DESCRIPTION OF EMBODIMENTS

Figure 1:
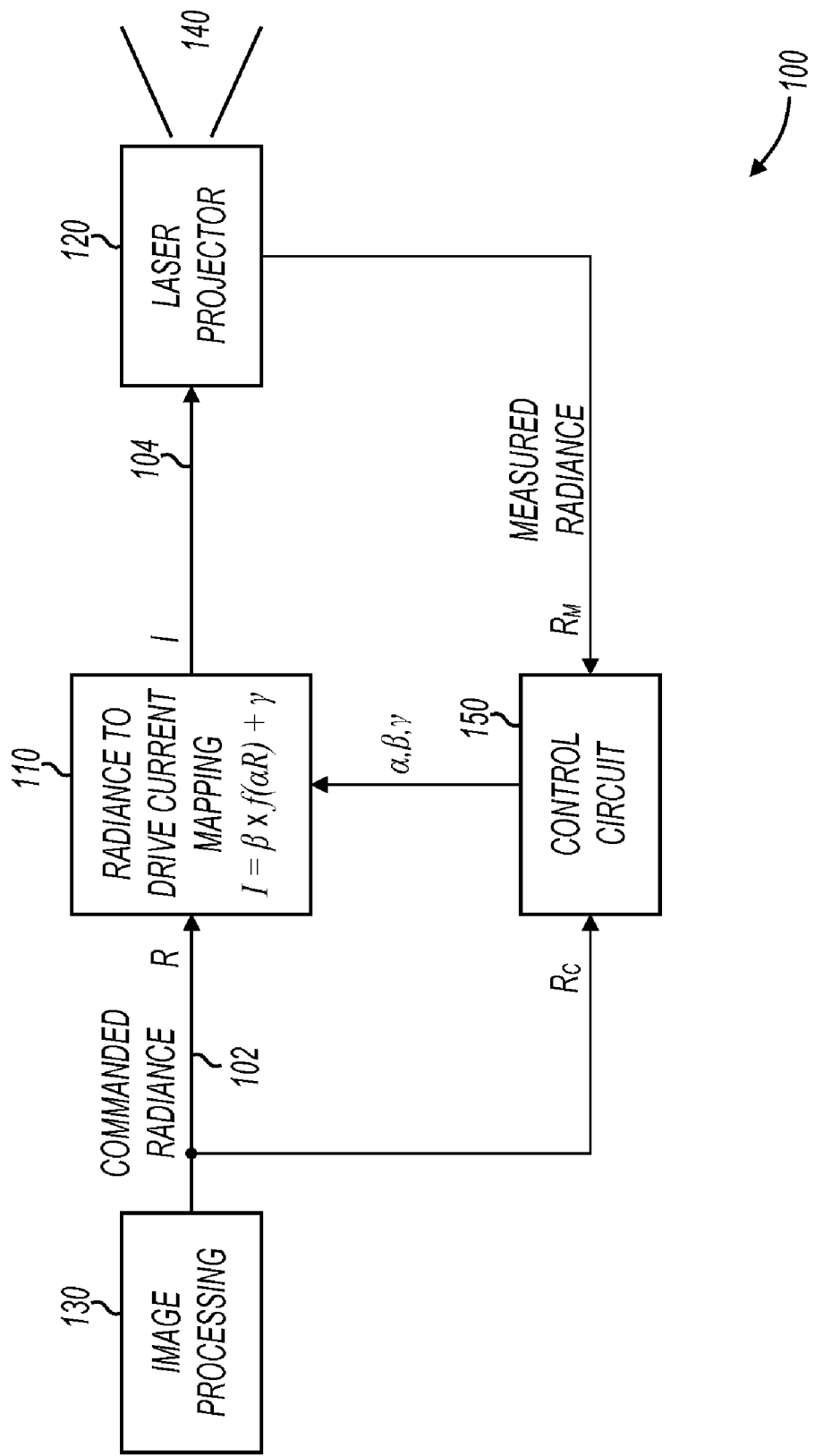
FIG. 1 shows a laser projection apparatus with closed loop laser control.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a laser projection apparatus with closed loop laser control. Apparatus 100 includes image processing circuitry 130, radiance to drive current mapping 110, laser projector 120 and control circuit 150.

In operation, laser projector 120 scans a light beam back and forth horizontally and up and down vertically to "paint" an image. The radiance of the light is changed at discrete points to illuminate pixels on a display surface. Image processing circuitry 130 determines the radiance of one more colors to be displayed at a pixel location in an image. Circuitry 130 presents a "commanded radiance" on node 102 to mapping component 110. Mapping component 110 maps the commanded radiance to a drive current value on node 104. Laser projector 120 receives the drive current value on node 104 and projects light at 140. In some embodiments, laser projector 120 receives a variable current on node 104 and this current is passed through a lasing device such as a laser diode or semiconductor laser. In other embodiments, laser projector 120 receives digital data on node 104 and laser projector 120 includes a digital-to-analog converter (DAC) to produce the current to pass through the lasing devices.

Laser projector 120 may include lasing devices that heat up or cool off based on ambient temperature changes. Further, lasing devices within projector 120 may heat up when emitting light. Further, multiple historical drive currents may have a cumulative heating effect on the lasing devices. As the temperature of the lasing device changes, the radiance for a given drive current also changes. This can result in variations in overall radiance (brightness) of the displayed image. Other factors may also affect lasing device radiance over time. For example, the radiance of lasing devices may change over time due to aging.

Some lasing devices may be more sensitive than others to temperature variations. For example, a lasing device that emits green light may be more sensitive to temperature variations than other color devices, such as red and blue laser diodes. When one lasing device is more sensitive than others, the color balance of the displayed image may change as a function of temperature.

Control circuit 150 accounts for effects of temperature variations and other factors and modifies the mapping of commanded radiance to drive current values within mapping component 110. In some embodiments, the mapping is modified to correct for radiance variations only. In other embodiments, the mapping is modified to correct for radiance as well as color balance.

Control circuit 150 provides three parameters: alpha, beta, and gamma, ($\alpha$, $\beta$, $\gamma$) to mapping component 110. Mapping component 110 scales the radiance data using a radiance gain value $\alpha$, scales the current using a drive current gain value $\beta$, and provides an offset to the current using a drive current offset value $\gamma$, as follows:

$$I = \beta \times f(\alpha R) + \gamma \quad (1)$$

where R is the commanded radiance, I is the resulting current, and $f(x)$ is a nominal R-I mapping that represents a nominal inverse laser characteristic.

Control circuit 150 receives the commanded radiance values from image processing circuit 130, and also receives measured radiance values from laser projector 120. Control circuit 150 compares the commanded radiance to the measured radiance and modifies one or more of ($\alpha$, $\beta$, $\gamma$) to correct for radiance and/or color balance variations.

Values for ($\alpha$, $\beta$, $\gamma$) may be iteratively adjusted. An iteration may have any period. For example, in some embodiments, ($\alpha$, $\beta$, $\gamma$) are updated for each video line in laser projector 120. Also for example, in some embodiments, ($\alpha$, $\beta$, $\gamma$) are updated multiple times within each video line. The parameters ($\alpha$, $\beta$, $\gamma$) may be abruptly modified at each iteration or may be slewed using small steps between iterations.

In some embodiments, control circuit 150 performs a "steepest descent" or "gradient descent" operation to determine values for ($\alpha$, $\beta$, $\gamma$) at each iteration. Gradient descent is based on the observation that if the real-valued function F(x) is defined and differentiable in a neighborhood of a point a, then F(x) decreases fastest if one goes from a in the direction of the negative gradient of F at α, −∇F(a), where ∇ is the gradient operator. It follows that, if b=a−Γ∇F(a) for Γ>0 a small enough number, then F(a)≧F(b). With this observation in mind, one starts with a guess $x_0$ for a local minimum of F, and considers the sequence $x_0, x_1, x_2, \ldots$ such that $x_{n+1}=x_n-\Gamma\nabla F(x_n)$, n≧0. This yields $F(x_0)\geq F(x_1)\geq F(x_2)\ldots$ such that the value of F decreases at each iteration.

In various embodiments of the present invention, a cost function derived from the error between commanded radiances and measured radiances is used for the function F of the previous paragraphs. For example, the following gradient descent equations may be used to iterate values for (α, β, γ) using cost functions J:

$$\alpha_{n+1}=\alpha_n-\Gamma\nabla J_\alpha(\alpha_n,\beta_n,\gamma_n) \quad (2)$$

$$\beta_{n+1}=\beta_n-\Gamma\nabla J_\beta(\alpha_n,\beta_n,\gamma_n) \quad (3)$$

$$\gamma_{n+1}=\gamma_n-\Gamma\nabla J_\gamma(\alpha_n,\beta_n,\gamma_n) \quad (4)$$

The cost function J may be any function that provides a metric related to the measured radiance. For example, suitable cost functions may include, but are not limited to, an error function, a squared error function, absolute value of an error function, normalized error function, or any combination. For specificity, and not by way of limitation, the remainder of this description treats the cost function J as a squared error $$J=\epsilon^2(\alpha,\beta,\gamma), \quad (5)$$

and the gradients with respect to the variables (α, β, γ) are the partial differentials of the cost function with respect to those variables, or:

$$\nabla J_\alpha = 2\epsilon\frac{\partial \epsilon}{\partial \alpha} \quad (6)$$

$$\nabla J_\beta = 2\epsilon\frac{\partial \epsilon}{\partial \beta} \quad (7)$$

$$\nabla J_\gamma = 2\epsilon\frac{\partial \epsilon}{\partial \gamma}. \quad (8)$$

In some embodiments, the error function may be the difference between the commanded radiance and the measured radiance, or:

$$\epsilon=R_C-R_m, \quad (9)$$

and the commanded radiance can be represented as a function of (α, β, γ) and the inverse of the mapping function as:

$$R_C = \frac{1}{\alpha}f^{-1}\left[\frac{I_C-\gamma}{\beta}\right], \quad (10)$$

where $f$ is the nominal R-I mapping function shown inside 110 in FIG. 1.

The partial differentials of the error function become:

$$\frac{\partial \epsilon}{\partial \alpha} = \frac{\partial R_C}{\partial \alpha} = \frac{-1}{\alpha^2}f^{-1}\left[\frac{I_C-\lambda}{\beta}\right] = \frac{-R_C}{\alpha}, \quad (11)$$

$$\frac{\partial \epsilon}{\partial \beta} = \frac{\partial R_C}{\partial \beta} = \frac{-1}{\alpha}\frac{\partial R_C}{\partial I}\bigg|_{\frac{I_C-\gamma}{\beta}}\left[\frac{I_C-\lambda}{\beta^2}\right] = \frac{-1}{\alpha\beta}\frac{\partial R_C}{\partial I}\bigg|_{\frac{I_C-\gamma}{\beta}}f(\alpha R_C), \text{ and} \quad (12)$$

$$\frac{\partial \epsilon}{\partial \gamma} = \frac{\partial R_C}{\partial \gamma} = \frac{1}{\alpha}\frac{\partial R_C}{\partial I}\bigg|_{\frac{I_C-\gamma}{\beta}}\left[\frac{-1}{\beta}\right] = \frac{-1}{\alpha\beta}\frac{\partial R_C}{\partial I}\bigg|_{\frac{I_C-\gamma}{\beta}}. \quad (13)$$

Various embodiments of control circuit 150 evaluate eqs. (11)-(13) when determining next values for (α, β, γ) at each iteration. Some embodiments of the present invention use fewer than all of (α, β, γ). In these embodiments only a subset of eqs. (11)-(13) may be evaluated during each iteration.

In some embodiments, parameters other than (α, β, γ) are employed. For example, referring back to eq. (1), a different parametric formulation for the radiance to current mapping may be employed, and different parameters (including more or less than three) may be adjusted at each iteration. A fourth parameter may be added to eq. (1) by squaring the current before or after the offset. Further, a general polynomial formulation may be used such as $I=\delta_3 f^3+\delta_2 f^2+\delta_1 f+\delta_0$ where $f$ is the nominal mapping and $\delta_{3-0}$ are parameters that may be optimized using any of the methods described herein.

The above description focuses on embodiments that utilize steepest descent or gradient descent operations to adjust parameters, although this is not a limitation of the present invention. Other iterative operations may be employed without departing from the scope of the present invention. For example, and not by way of limitation, various embodiments may employ conjugate gradient methods, Newton's method, Quasi-Newton's method, or other suitable methods.

Control circuit 150 may have hardware or a combination of hardware and software configured to perform the functions described. For example, in some embodiments, an application specific integrated circuit (ASIC) performs substantially all of the above computations in hardware multiple times for each video line. Also for example, in some embodiments, a processor may perform the above computations in software once for each video frame. The various embodiments of the invention are not limited to a hardware implementation, a software implementation, or any particular combination.

Figure 2A:
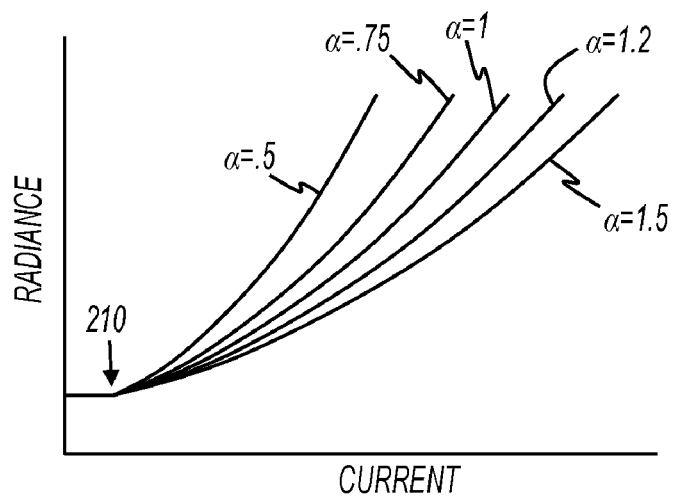
FIGS. 2A-2C show various laser characteristics and how they may be compensated.
Figure 2B:
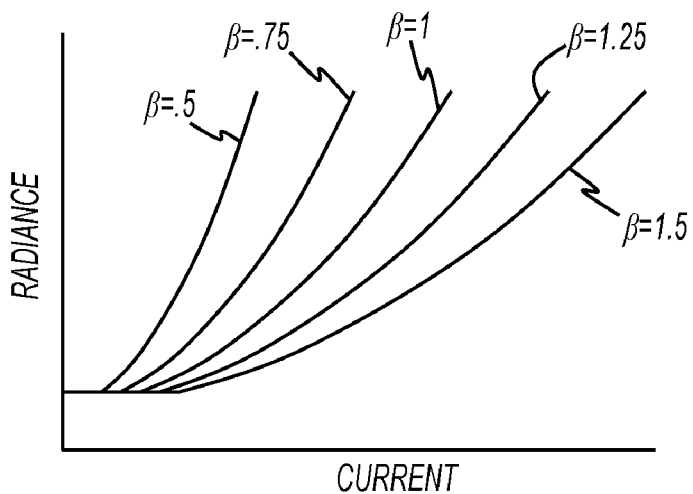
Figure 2C:
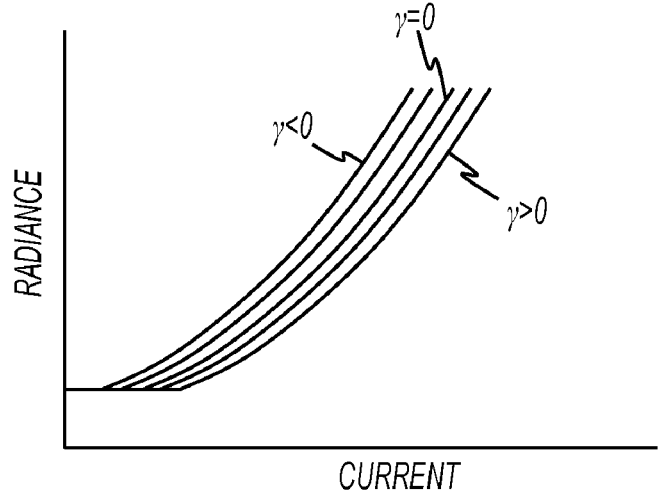

FIGS. 2A-2C shows various laser characteristics and how they may be compensated. FIG. 2A shows that the radiance gain value α can compensate for changes in slope, but not changes in the threshold 210. FIG. 2B shows that the drive current gain value β can compensate for both changes in slope as well as changes in threshold, while FIG. 2C shows that the drive current offset value γ can compensate for threshold. As shown in FIGS. 2A-2C, changes in laser characteristics can be compensated for by modifying one or more of (α, β, γ).

Figure 3:
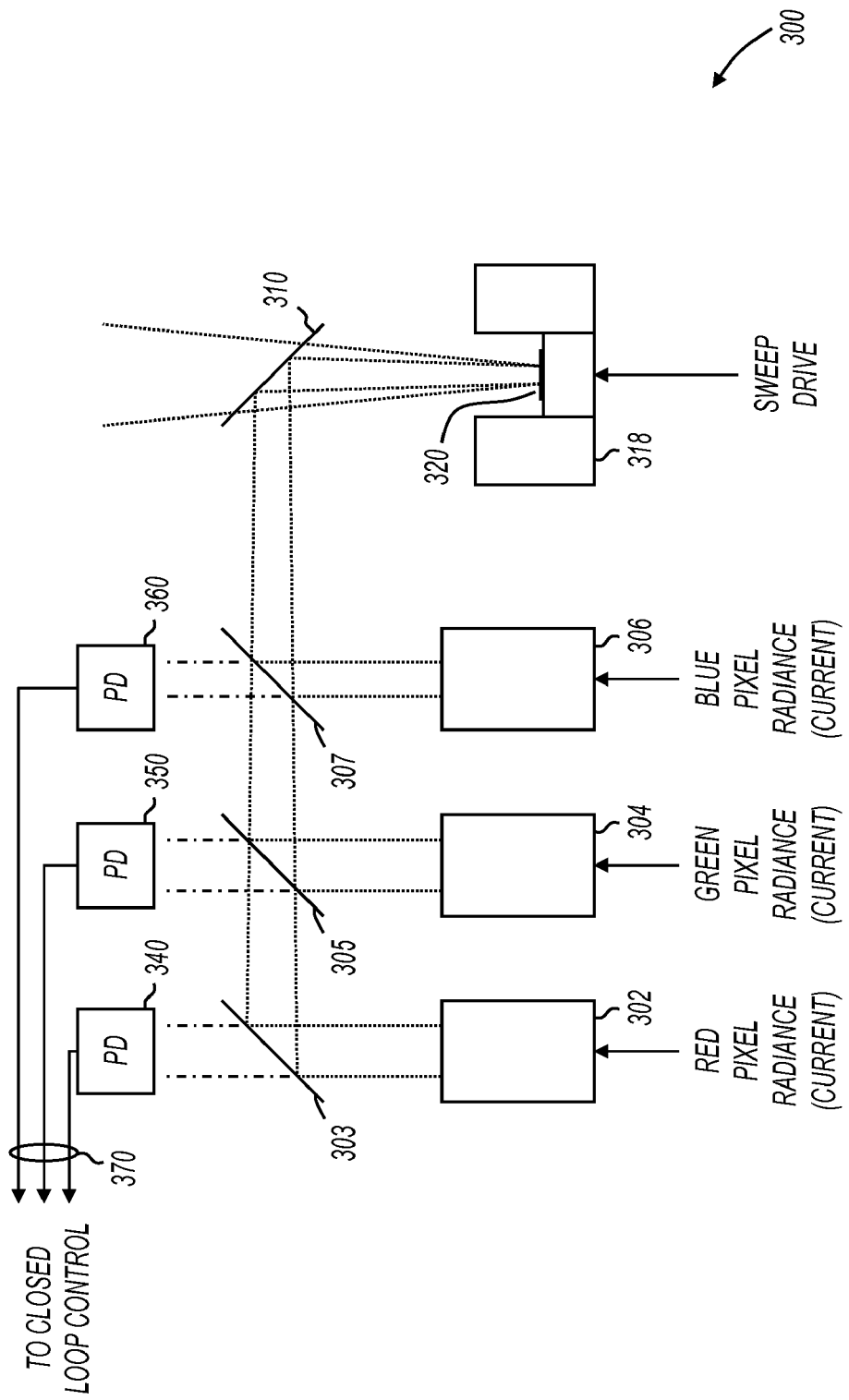
FIGS. 3 and 4 show micro-projectors.

FIG. 3 shows a micro-projector. Projector 300 may be used in apparatus 100 (FIG. 1) as laser projector 120, although this is not a limitation of the present invention.

Projector 300 includes lasing devices 302, 304, and 306. Lasing devices 302, 304, and 306 may be any type or combination of laser light emitting devices, including but not limited to vertical extended cavity surface emitting lasers (VECSEL), distributed Bragg reflector (DBR) lasers, diode lasers, or any other. Projector 300 also includes mirrors 303, 305, and 307, filter/polarizer 310, and micro-electronic machine (MEMS) device 318 having mirror 320. The lasing devices are driven by red, green, and blue radiance data (current) as described with reference to FIG. 1. Red, green, and blue light is provided by the lasing devices. Lasers typically produce light as a column, and this column emerges as a narrow beam. When each beam is directed at the MEMS mirror (either directly or through guiding optics) the colors of light can be mixed on the surface of the mirror, pixel by pixel.

The MEMS mirror rotates on two axes to sweep the light beams in both horizontal and vertical directions. The trajectory that the beam takes is a function of the signals received from the sweep drive. In some embodiments, the beam may sweep back and forth horizontally in a sinusoidal pattern. Further, in some embodiments, the beam may sweep up and down vertically in a sinusoidal pattern. In general, the beam may be swept in any combination of horizontal and vertical patterns, including linear and non-linear patterns. Pixels may be displayed when the beam is sweeping in one direction or in both directions. For example, in some embodiments, pixels may be displayed as the beam sweeps down in the vertical direction, but not when the beam sweeps back up. Also for example, in some embodiments, pixels may be displayed as the beam sweeps down as well as when the beam sweeps up in the vertical direction.

This process of picture-building can be repeated many times per second, to reproduce moving pictures. Therefore, a MEMS mirror and three colored light sources can function like a traditional CRT monitor or television set, but without the metal and glass vacuum tube, and without the phosphors on a screen. Instead, this produces a small projector, with a nearly infinite focal point.

By using solid-state colored continuous beam lasing devices, it is possible to build such a projection device on the millimeter scale. Further, by modulating the power to each lasing device as needed to produce a particular color, it is possible to greatly reduce the electrical requirements of such a device. Together, this yields a projection device that can fit into a small form factor device, and that can run reliably on its stored battery power. The MEMS based projector is described as an example, and the various embodiments of the invention are not so limited. For example, other projector types may be included in projection systems with laser control as described herein without departing from the scope of the present invention.

Projector 300 also includes photodetectors (PD) 340, 350, and 360. Photodetectors 340, 350, and 360 are aligned such that each one detects light of a different color passing through one of mirrors 303, 305, and 307. Mirrors 303, 305, and 307 allow a predetermined amount of light to pass through to the photodetectors while reflecting the remaining light to mirror 310. The photodetectors supply measured radiance values to a closed loop control circuit at 370.

Although photodetectors are shown detecting light on the back sides of mirrors 303, 305, and 307, this is not a limitation of the present invention. In various embodiments of the present invention, photodetectors are placed in various locations to detect the different colors of light.

Photodetectors 340, 350, and 360 supply measured radiance $R_M$ data to one or more feedback circuit(s) such as control circuit 150 (FIG. 1). In response to the measured radiance data, control circuit 150 may then adjust parameters ($\alpha$, $\beta$, $\gamma$) for each lasing device separately using a gradient descent operation as described above.

Figure 4:
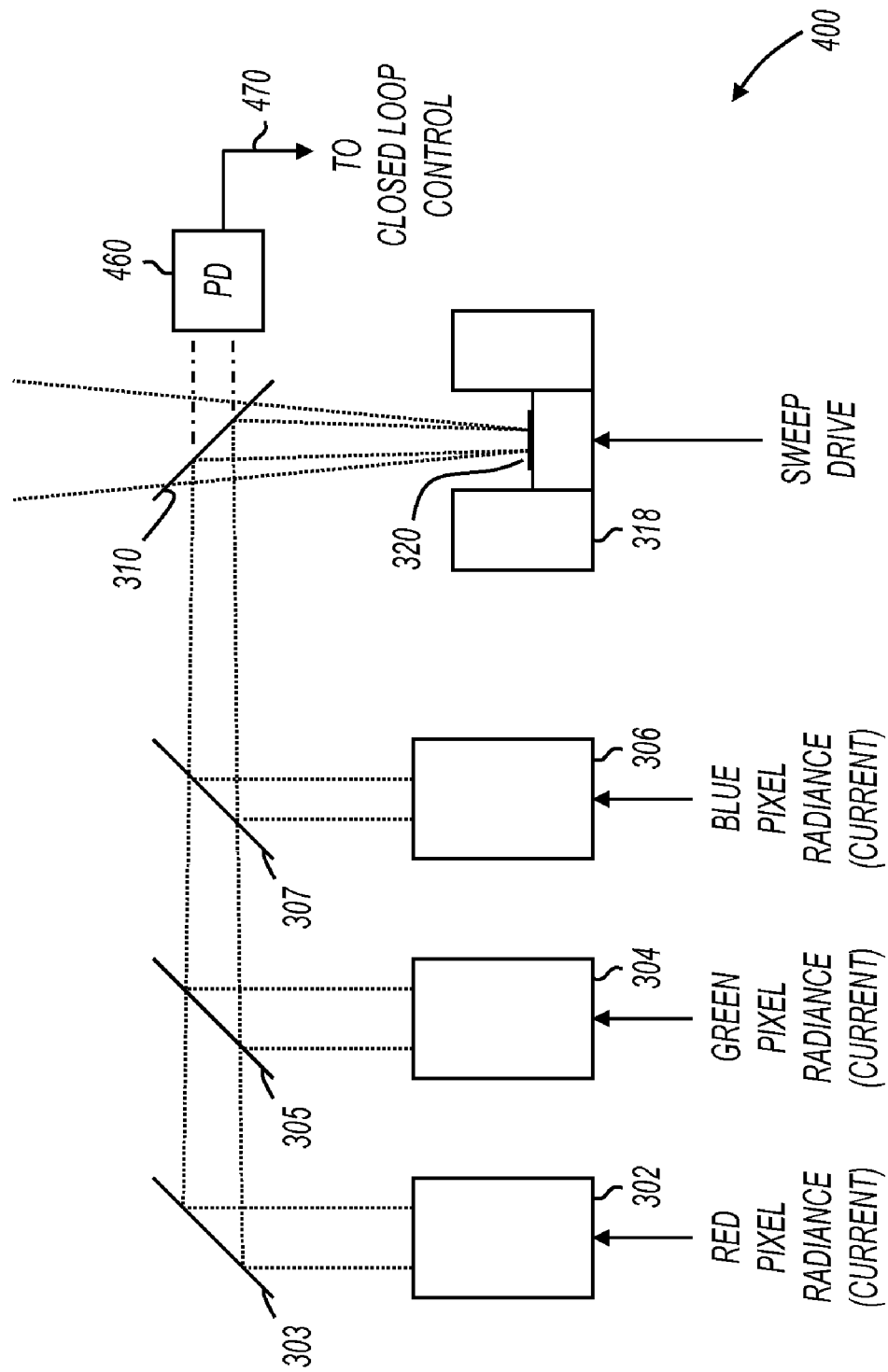

FIG. 4 shows a micro-projector. Projector 400 may be used in apparatus 100 (FIG. 1) as laser projector 120, although this is not a limitation of the present invention.

Projector 400 includes lasing devices 302, 304, and 306, mirrors 303, 305, and 307, filter/polarizer 310, and microelectronic machine (MEMS) device 318 having mirror 320, all of which are described above with reference to FIG. 3. Projector 400 also includes integrated photodetector 460 situated on the back side of filter/polarizer 310. Photodetector 460 detects light for all three colors and provides measured radiance data for all three lasing devices at 470.

Although integrated photodetector 460 is shown situated on the backside of filter/polarizer 310, this is not a limitation of the present invention. For example, photodetector 460 may be situated anywhere suitable to measure the radiance of multiple lasing devices.

In some embodiments, integrated photodetector 460 measures radiance of one or more lasers separately. For example, photodetector 460 may measure green light and then send measured radiance $R_M$ for the green light back to control circuit 150 (FIG. 1). In response to the measured radiance data, control circuit 150 may then adjust parameters ($\alpha$, $\beta$, $\gamma$) for the green laser using a gradient descent operation as described above.

Figure 5:
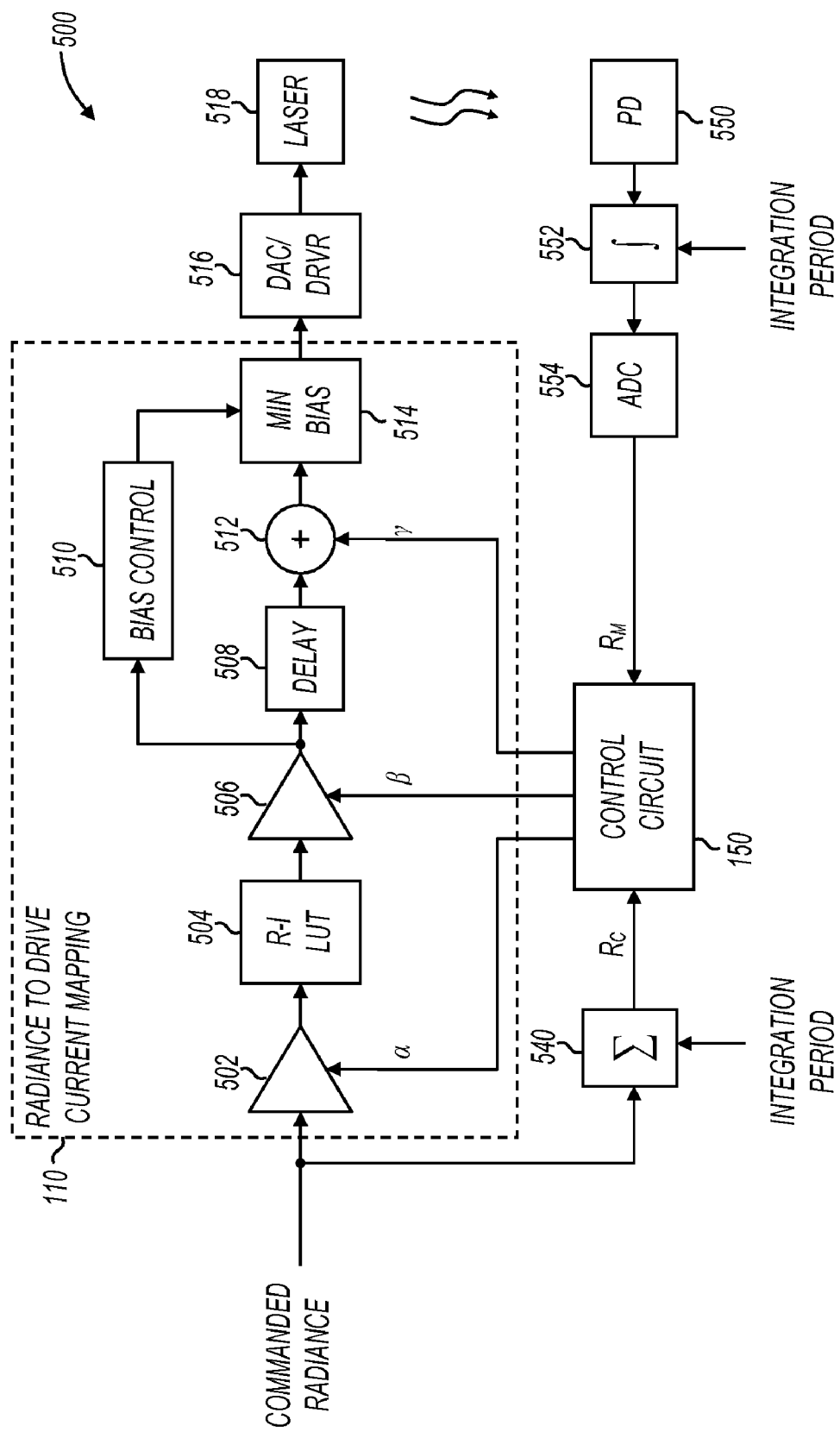
FIG. 5 shows a laser projection apparatus with closed loop laser control.

FIG. 5 shows a laser projection apparatus with closed loop laser control. Laser projection apparatus 500 includes radiance to drive current mapping component 110 and control circuit 150, both of which are described above with reference to FIG. 1. Laser projection apparatus 500 also includes digital-to-analog converter (DAC) and driver 516, lasing device 518, photodetector (PD) 550, integrator 552, analog-to-digital converter (ADC) 554, and accumulator 540.

Radiance to drive current mapping component 110 includes radiance-to-current (R-I) look-up table (LUT) 504, radiance gain block 502 to scale commanded radiance by a radiance gain value $\alpha$, drive current gain block 506 to scale the drive current value by a drive current gain value $\beta$, and offset block 512 to offset the drive current value by a drive current offset value $\gamma$. Component 110 also includes a bias control component that includes delay circuit 508, bias control circuit 510, and minimum bias circuit 514.

In operation, a commanded radiance value is provided to the R-I mapping component 110, which provides a drive current value to DAC/driver 516. DAC/driver 516 produces an analog drive current that is driven through lasing device 518. DAC/driver 516 includes a digital-to-analog converter as well as driver circuitry to drive the lasing device. The DAC may accept any number of digital input bits and may have any resolution. For example, in some embodiments, the DAC may accept eight, ten, or more input bits. The driver circuit may include analog circuits such as amplifiers and drivers suitable to drive lasing devices.

Photodetector 550, integrator 552, and ADC 554 form a radiance measurement apparatus. Photodetector 550 measures the radiance of lasing device 518. Photodetectors typically output a current that is a function of the measured light. Accordingly, a transimpedance amplifier may be incorporated into PD 550 to convert the current into a voltage. Integrator 552 integrates the measured radiance to provide an average of the PD output over an integration period. The integration period may be any length. In some embodiments, the integration period is long enough to increase the signal-to-noise ratio (SNR) of the PD output, but is short enough to allow fast closed loop control. In some embodiments, integrator 514 is incorporated into the photodetector by virtue of the natural response time of the photodetector. For example, the lasing device may emit pulsed light on a pixel by pixel basis, and the photodetector output may reflect the average amount of light incident on the photodetector over a number of pixels.

ADC 554 converts the output of integrator 552 to a digital value and provides that digital value to control circuit 150. Control circuit 150 iteratively modifies R-I mapping control parameters ($\alpha$, $\beta$, $\gamma$) using a gradient descent operation as described with reference to FIG. 1.

The commanded radiance is provided to accumulator 540 which sums the commanded radiance over the same integration period as integrator 552. In some embodiments, integrator 552 is omitted, and accumulator 540 integrates over a period to match the natural response of circuits in the measurement path, such as PD 550.

In some embodiments, the integration period is set such that the R-I mapping control parameters ($\alpha$, $\beta$, $\gamma$) are modified fast enough to compensate for dynamic changes in the behaviour of lasing device 518. For example, the integration period may be set to less than a video line such that the R-I mapping control parameters ($\alpha$, $\beta$, $\gamma$) are updated multiple times over each video line.

In some embodiments, control circuit 150 determines new values for R-I mapping control parameters ($\alpha$, $\beta$, $\gamma$) after each integration period and then slews the actual values of R-I mapping control parameters ($\alpha$, $\beta$, $\gamma$) during the next integration period rather than abruptly changing them. For example, if an integration period lasts for 50 pixels, then the R-I mapping control parameters ($\alpha$, $\beta$, $\gamma$) may be modified by one fiftieth of the entire change value for each pixel.

R-I LUT 504 is a modifiable device capable of storing mappings from commanded radiance values to lasing device current values. For example, R-I LUT 504 may be a random access memory device to hold the look-up table. In some embodiments, the look-up table may be implemented in a dual port memory that can be modified from one port and "looked up" from another port. In other embodiments, R-I LUT 504 may be replaced by a mathematical function to map radiance values to drive current values. R-I LUT 504 may be implemented in any manner without departing from the scope of the present invention.

Bias control circuit 510 "looks ahead" in the video path and conditionally provides a minimum bias value for the drive current value. For example, if the commanded radiance has a very low value for a number of pixels (e.g., for a video line), then bias control circuit 510 may provide a drive current value below a turn-on threshold, but large enough to preheat laser 518. In some embodiments, bias control circuit 510 preheats laser 518 only when future pixels are to be displayed. For example if laser 518 turns on at 100 mA of current (threshold of 100 mA), and future pixels in the video path call for 90 mA or less, then bias control circuit 510 does not provide a minimum bias. However, if future pixels call for more than 100 mA of current (corresponding to non-zero future light output), and the current pixels call for less than 90 mA, then for the current pixels, and up until the future pixels call for the non-zero light output, bias control circuit 510 may inject a minimum bias current of 90 mA to preheat laser 518.

Preheating laser 518 may provide a faster turn-on capability. For example, some types of lasing devices may turn on very quickly when preheated, but may take longer to turn on when not preheated.

Laser projection apparatus 500 shows a single laser 518 with a single radiance to drive current mapping component 110. In some embodiments, laser projection apparatus 500 is a single color channel in a color laser projector. For example, laser projection apparatus 500 may be a green color channel, and may be combined with a blue and red color channel. The blue and red color channels may or may not include a corresponding control circuit 150.

Figure 6:
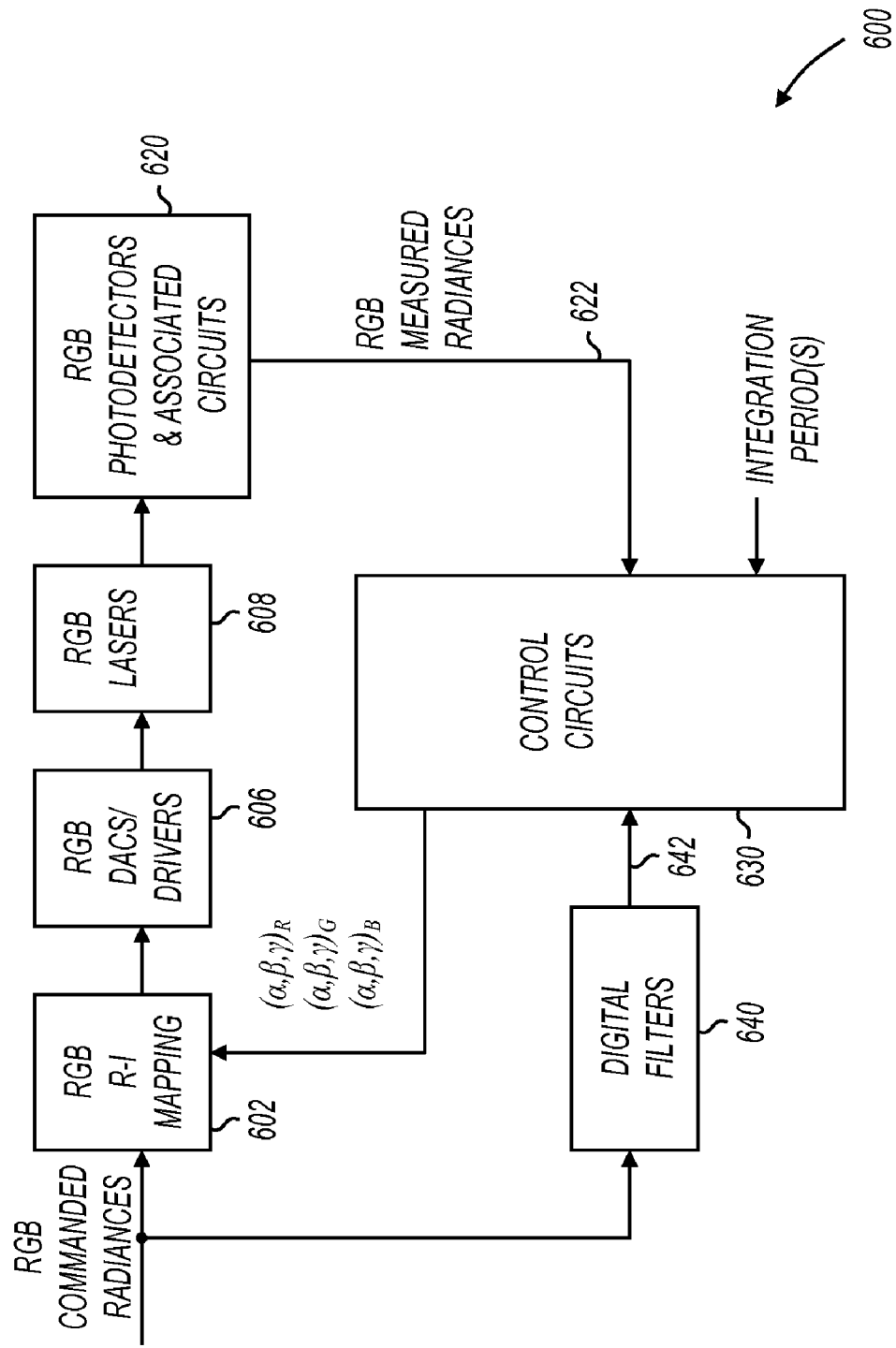
FIG. 6 shows a color laser projection apparatus with closed loop laser control.

FIG. 6 shows a color laser projection device with closed loop laser control. Laser projection device 600 includes red/green/blue (RGB) radiance-to-current (R-I) mapping components 602, RGB DAC/drivers 606, RGB lasers 608, RGB photodetectors and associated circuits 620, digital filters 640, and control circuits 630.

RGB R-I mapping components 602 receive commanded radiances for red, green, and blue lasing devices. In some embodiments, the R-I mapping components 602 are look-up tables that are maintained in separate memory devices, and in other embodiments, R-I mapping components 602 are look-up tables share a single memory device. In still further embodiments, R-I mapping components 602 are implemented as mathematical functions. The R-I mapping components independently map red, green, and blue commanded radiance values to lasing device drive current values.

RGB DAC/drivers 606 convert the RGB laser drive current values to drive currents, and RGB lasing devices 608 are driven with those currents to produce a composite color pixel. For example, RGB lasing devices 608 may correspond to IS lasing devices 302, 304, and 306 (FIGS. 3, 4).

RGB photodetectors and associated circuits 620 detect the amount of light emitted from laser diodes 608. For example, the RGB photodetectors may be photodetectors 340, 350, and 360 (FIG. 3) or photodetector 460 (FIG. 4). The associated circuits may include integrators, ADCs, calibration circuits, as well as other suitable circuitry to condition and produce the RGB measured radiances at 622.

The RGB commanded radiances are also provided to digital filters 640. Digital filters 640 filter the commanded radiance values prior to comparison with the measured radiance values at 622. In some embodiments, digital filters 640 attempt to compensate for the response of all circuits in the loop. For example, in some embodiments, digital filters 640 compensate for the response of the drivers in RGB DAC/drivers 606 as well as the response of the RBG photodetectors.

Control circuits 630 compute the error between radiance values for each color provided at 622 and 642. In some embodiments, the error information is used to modify the R-I mapping component for one or more colors to correct for radiance variations. For example, if the measured radiance of all three lasing devices is differs from the commanded radiance, then parameters ($\alpha$, $\beta$, $\gamma$) for each of the R-I mapping components may be modified to effect changes in lasing device drive currents. Also for example, if the measured radiance of one lasing device is below the expected radiance, then parameters ($\alpha$, $\beta$, $\gamma$) for the R-I mapping component corresponding to that lasing device may be modified to effect a change in the lasing device drive current.

In some embodiments, control circuits modify the R-I mapping components for one or more colors for color balance tracking. For example, the R-I mapping components may be modified to maintain radiance ratios between the colors to maintain a white point, such as a D65 white point. In some embodiments, the R-I mapping component for one color is modified to correct for radiance variation, and the remaining two R-I mapping components are modified to correct for color balance variations. For example, in some embodiments, the green lasing device may be significantly more sensitive to temperature variations. In these embodiments, a look-up table corresponding to the green lasing device may be modified to correct for luminance variations, and look-up tables for the red and blue lasing devices may be modified to maintain the proper ratios for color balance.

In some embodiments, the red, green, and blue mapping components 602 are updated at different rates. For example, using different integration periods, control circuits 630 may update each of the red, green, and blue mapping components at different rates. For example, in some embodiments, the green lasing device may be more sensitive to temperature variations, and so may be updated more frequently than the red and blue.

The various components shown in FIG. 6 may be implemented in hardware, software, or any combination thereof For example, digital filters 640 and/or control circuits 630 may be implemented in dedicated hardware circuits, parameterizable hardware circuits, or in software running on a processor.

Figure 7:
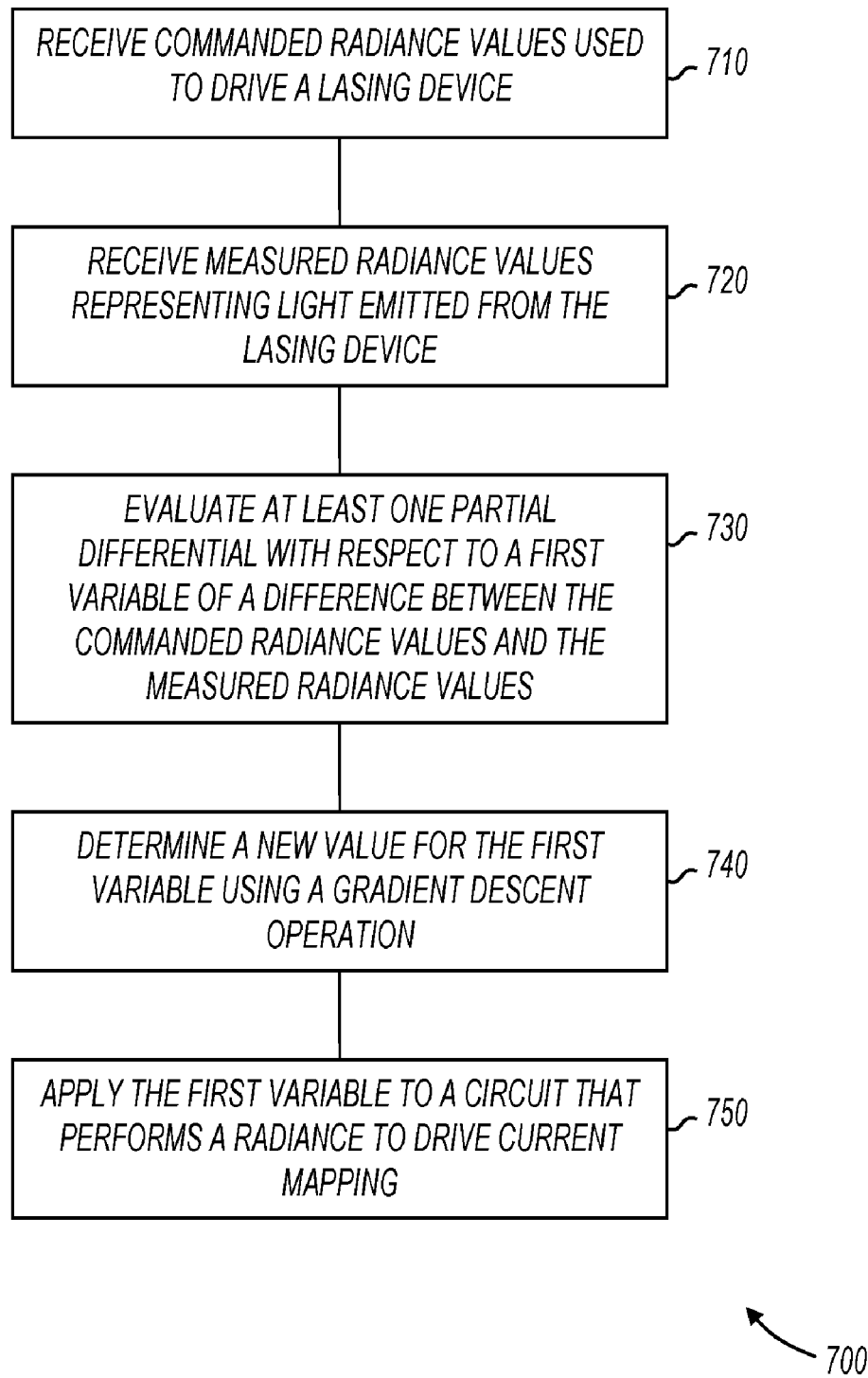
FIG. 7 shows a flowchart in accordance with various embodiments of the present invention.

FIG. 7 shows a flowchart in accordance with various embodiments of the present invention. In some embodiments, method 700, or portions thereof, is performed by a laser projector, a mobile device, or the like, embodiments of which are shown in previous figures. In other embodiments, method 700 is performed by an integrated circuit or an electronic system. Method 700 is not limited by the particular type of apparatus performing the method. The various actions in method 700 may be performed in the order presented, or may be performed in a different order. Further, in some embodiments, some actions listed in FIG. 7 are omitted from method 700.

Method 700 is shown beginning with block 710 in which commanded radiance values used to drive a lasing device are received. This corresponds to $R_C$ as shown in the previous figures. The commanded radiance values may be accumulated over a number of pixels in an image (540, FIG. 5), or may be for single pixels. For example, the commanded radiance values may be accumulated over an integration period that is less than a scan line in a video image.

At 720, measured radiance values are received. The measured radiance values represent light emitted from the lasing device. The measured radiance values may be integrated over the same integration period as the commanded radiance values. Appropriate scaling may be applied to both the commanded radiance values and the measured radiance values such that a difference between them is substantially zero when the lasing device is performing as desired. If the lasing device is not performing as desired (e.g., the measured radiance differs from the commanded radiance), then a radiance to drive current mapping is modified using a gradient descent operation as further described herein.

At 730, at least one partial differential with respect to a first variable of a difference between the commanded radiance values and the measured radiance values is evaluated. This operation corresponds to the evaluation of one or more of eqs. (11)-(13), above, where the first variable is any of $(\alpha, \beta, \gamma)$. At 740, a new value is determined for the first variable using a gradient descent operation. The gradient descent operation is shown in eqs. (2)-(4), above.

At 750, the first variable is applied to a circuit that performs radiance to drive current mapping. In some embodiments, this corresponds to control circuit 150 applying one of $(\alpha, \beta, \gamma)$ to mapping component 110 (FIGS. 1, 5). In some embodiments, the first variable is changed abruptly after each iteration of the gradient descent operation, and in other embodiments, the first variable is slewed from one steady state value to another between iterations.

The operations of method 700 may be applied to one or more color channels in a color laser projector. For example, in some embodiments, apparatus 500 (FIG. 5) may be instantiated three times: once each for red, green, and blue. (See FIGS. 3, 4). In these embodiments, one or more of $(\alpha, \beta, \gamma)$ are modified for each channel. In other embodiments, method 700 may be applied to one color channel in a color laser projector. For example, a particular green laser embodiment may be more sensitive to temperature effects, and apparatus 500 (FIG. 5) may be included for the green color channel, but not the red and blue color channel.

Figure 8:
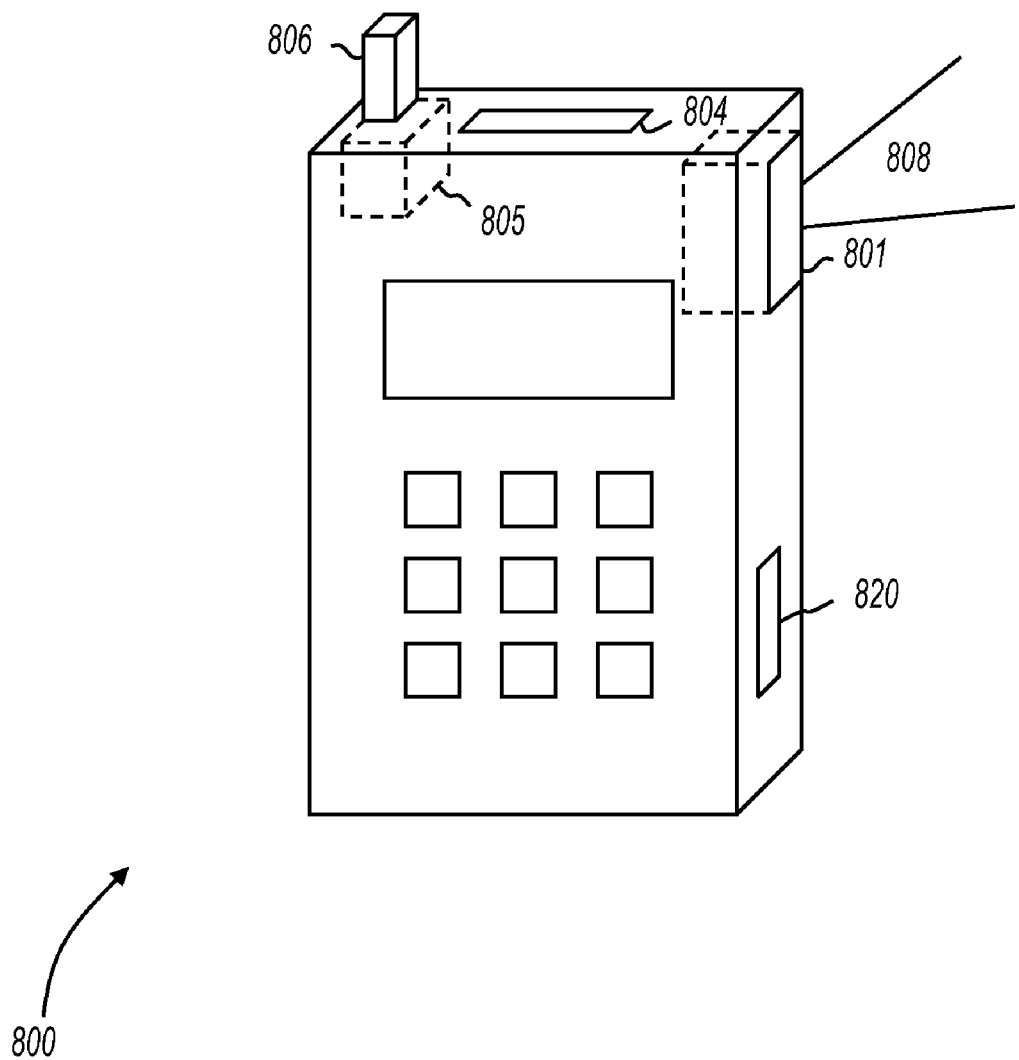
FIG. 8 shows a mobile device in accordance with various embodiments of the present invention.

FIG. 8 shows a mobile device in accordance with various embodiments of the present invention. Mobile device 800 may be a hand held projection device with or without communications ability. For example, in some embodiments, mobile device 800 may be a handheld projector with little or no other capabilities. Also for example, in some embodiments, mobile device 800 may be a portable music player. Also for example, in some embodiments, mobile device 800 may be a device usable for communications, including for example, a cellular phone, a smart phone, a personal digital assistant (PDA), a global positioning system (GPS) receiver, or the like. Further, mobile device 800 may be connected to a larger network via a wireless (for example, WiMax) or cellular connection, or this device can accept data messages or video content via an unregulated spectrum (for example, WiFi) connection.

Mobile device 800 includes laser projector 801 to create an image with light 808. Similar to other embodiments of projection systems described above, mobile device 800 may include closed loop laser control to control mapping of radiance to drive current values and also to provide minimum drive current values to preheat lasing devices.

In some embodiments, mobile device 800 includes antenna 806 and electronic component 805. In some embodiments, electronic component 805 includes a receiver, and in other embodiments, electronic component 805 includes a transceiver. For example, in GPS embodiments, electronic component 805 may be a GPS receiver. In these embodiments, the image displayed by laser projector 801 may be related to the position of the mobile device. Also for example, electronic component 805 may be a transceiver suitable for two-way communications. In these embodiments, mobile device 800 may be a cellular telephone, a two-way radio, a network interface card (NIC), or the like.

Mobile device 800 also includes memory card slot 804. In some embodiments, a memory card inserted in memory card slot 804 may provide a source for video data to be displayed by laser projector 801. Memory card slot 804 may receive any type of solid state memory device, including for example, Multimedia Memory Cards (MMCs), Memory Stick DUOs, secure digital (SD) memory cards, and Smart Media cards. The foregoing list is meant to be exemplary, and not exhaustive.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. An apparatus comprising:
   image processing circuitry to command a radiance value;
   a mapping component to convert the radiance value to a drive current value according to:

$$I = \beta \times f(\alpha R) + \gamma;$$

wherein I is the drive current, R is the radiance value, $\alpha$ is a radiance gain value, $\beta$ is a drive current gain value, and $\gamma$ is a drive current offset value; and
   a control circuit to use a gradient descent operation to iteratively determine values for $\alpha$, $\beta$, and $\gamma$.

2. The apparatus of claim 1 further comprising:
   a first lasing device coupled to be driven by the drive current;
   a photodetector to measure radiance of light produced by the lasing device; and an integrator responsive to the photodetector coupled to integrate measured radiance over less than a video line and provide a result to the control circuit.

3. The apparatus of claim 2 further comprising a second lasing device and a third lasing device.

4. The apparatus of claim 3 wherein the first lasing device comprises a green laser.

5. The apparatus of claim 1 further comprising a minimum bias circuit to look ahead in a video path and preheat the first lasing device based on future pixel data.

6. The apparatus of claim 5 wherein the minimum bias circuit includes a bias control circuit to produce a minimum drive current below a turn-on threshold of the lasing device.

7. A circuit comprising:
- a lasing device to emit light;
- a look up table to map commanded radiance values to drive current values for the lasing device;
- a first gain block to scale the commanded radiance values by a radiance gain, $\alpha$, prior to the look up table;
- a second gain block to scale the drive current values by a drive current gain, $\beta$; and
- a minimum bias circuit to provide a minimum bias to the drive current values to preheat the lasing device.

8. The circuit of claim 7 further comprising a control circuit to produce control signals for $\alpha$ and $\beta$ using a gradient descent operation.

9. The circuit of claim 8 further comprising a radiance measurement apparatus to detect light emitted from the lasing device and to provide a measured radiance $R_M$ to the control circuit.

10. The circuit of claim 8 further comprising an offset block to offset the drive current values by a drive current offset, $\gamma$.

11. The circuit of claim 9 wherein the radiance measurement apparatus includes an analog integrator to integrate the measured radiance over less than a scan line in a video image.

12. A method comprising:
- receiving commanded radiance values used to drive a lasing device;
- receiving measured radiance values representing light emitted from the lasing device;
- evaluating at least one partial differential with respect to a first variable of a difference between the commanded radiance values and the measured radiance values;
- determining a new value for the first variable using a gradient descent operation; and
- applying the first variable to a circuit that performs radiance to drive current mapping.

13. The method of claim 12 wherein the first variable is a radiance gain value, $\alpha$, to scale the commanded radiance value.

14. The method of claim 12 wherein the first variable is a drive current gain value, $\beta$, to scale a drive current value produced by the drive current mapping.

15. The method of claim 12 wherein the first variable is a drive current offset value, $\gamma$, to offset the drive current value.

16. The method of claim 12 wherein applying the first variable to a control circuit comprises slewing the first variable value between iterations of determining the new values for the first variable.

* * * * *

UNITED STATES PATENT AND TRADEMARK OFFICE
CERTIFICATE OF CORRECTION

PATENT NO. : 8,165,179 B2  Page 1 of 1
APPLICATION NO. : 12/343224
DATED : April 24, 2012
INVENTOR(S) : Margaret K. Brown et al.

It is certified that error appears in the above-identified patent and that said Letters Patent is hereby corrected as shown below:

TITLE PAGE; item (75);
Change "Lifford McLauchlin" to "Lifford McLauchlan" in the Inventors category.

Signed and Sealed this
Nineteenth Day of June, 2012

David J. Kappos
*Director of the United States Patent and Trademark Office*